(12) United States Patent
Favrat et al.

(10) Patent No.: US 7,075,585 B2
(45) Date of Patent: Jul. 11, 2006

(54) BROADBAND RECEIVER HAVING A MULTISTANDARD CHANNEL FILTER

(75) Inventors: Pierre Favrat, Sunnyvale, CA (US); Didier Margairaz, Saratoga, CA (US); Alain-Serge Porret, Sunnyvale, CA (US); Dominique Python, Sunnyvale, CA (US)

(73) Assignee: Xceive Corporation, Santa Clara, CA (US)

( * ) Notice: Subject to any disclaimer, the term of this patent is extended or adjusted under 35 U.S.C. 154(b) by 592 days.

(21) Appl. No.: 10/236,645

(22) Filed: Sep. 6, 2002

(65) Prior Publication Data

US 2004/0061804 A1 Apr. 1, 2004

Related U.S. Application Data

(60) Provisional application No. 60/322,548, filed on Sep. 17, 2001.

(51) Int. Cl.
*H04N 3/27* (2006.01)
*H04N 5/455* (2006.01)

(52) U.S. Cl. .................. 348/554; 348/726; 348/725; 375/340; 455/189.1

(58) Field of Classification Search ............. 348/554, 348/555, 558, 725, 726; 375/316, 340, 343; 455/189.1, 245.2, 179.1, 188.1, 192.1, 334
See application file for complete search history.

(56) References Cited

U.S. PATENT DOCUMENTS

| 5,737,035 | A | 4/1998 | Rotzoll .................. 348/725 |
| 5,784,414 | A * | 7/1998 | Bruekers et al. .......... 375/324 |
| 6,118,499 | A * | 9/2000 | Fang ..................... 348/726 |
| 6,177,964 | B1 | 1/2001 | Birleson et al. ........... 348/725 |
| 6,369,857 | B1 | 4/2002 | Balaban et al. ........... 348/555 |
| 6,424,683 | B1 * | 7/2002 | Schollhorn .............. 375/332 |
| 6,643,502 | B1 | 11/2003 | Van De Plassche et al. |
| 2002/0051091 | A1 * | 5/2002 | Dedieu et al. ............ 348/723 |

FOREIGN PATENT DOCUMENTS

WO  WO 01/20792 A1  3/2001

* cited by examiner

*Primary Examiner*—Victor R. Kostak
(74) *Attorney, Agent, or Firm*—Patent Law Group LLP; Carmen C. Cook

(57) ABSTRACT

A television (TV) receiver includes a multi-standard channel filter with a programmable intermediate frequency adapted to receive television signals in a variety of television standards and formats. In one embodiment, a receiver includes a tuner and a channel filter. The tuner receives input RF signals encoding information in one of a number of formats and converts the input RF signals to intermediate signals having an intermediate frequency (IF). The intermediate signals are coupled to the channel filter. The channel filter includes an anti-aliasing filter for filtering the intermediate signals, an analog-to-digital converter for sampling the filtered intermediate signals and generating a digital representation thereof, and a signal processor for processing the digital representation of the intermediate signals in accordance with the format of the input RF signal. The signal processor generates digital output signals indicative of information encoded in the input RF signal.

21 Claims, 5 Drawing Sheets

BROADBAND RECEIVER HAVING A MULTISTANDARD CHANNEL FILTER

CROSS-REFERENCE TO RELATED APPLICATION

The present application claims the benefit of U.S. Provisional Patent Application No. 60/322,548, filed Sep. 17, 2001, and entitled "Broadband Receiver for Multistandard Analog TV, Digital TV, and Data Channels", which application is incorporated herein by reference in its entirety.

FIELD OF THE INVENTION

The present invention relates to a television signal receiver, and in particular, the present invention relates to a broadband television signal receiver for receiving multistandard analog television signals, digital television signals and data channels.

DESCRIPTION OF THE RELATED ART

A television or video recorder includes a television signal receiver (or television receiver) to receive terrestrial broadcast, cable television or satellite broadcast television signals and to process the television signals into the appropriate video signals for display or for recording. Television signals are transmitted in analog or digital formats and in accordance with a variety of standards. For analog television transmission, the NTSC (National Television Standards Committee) standard, the PAL (Phase Alternate Lines) standard, and the SECAM (Sequential Couleur Avec Memoire) standard are widely adopted. On the other hand, for digital television transmission, the DVB (Digital Video Broadcast) format and the ATSC (Advanced Television Standards Committee) format are available. Because the different television formats and different television standards are incompatible, television receivers are traditionally made specifically for the analog or digital format and for a specific standard. Thus, televisions or video recording equipments are dedicated equipments which can only be used in the geographic regions in which the television standard is broadcasted.

Multi-standard equipments are known. In most instances, multi-standard equipments are built by duplicating the hardware necessary to receive television signals in different formats and in several standards, increasing the complexity and the cost of manufacturing the equipments.

FIG. 1 is a block diagram of a conventional television receiver. The operation of television receiver 10 includes two main components. First, receiver 10 receives the incoming signal and converts the incoming radio frequency (RF) signal to an intermediate frequency (IF) signal. Then, receiver 10 converts the IF signal to the baseband signals. The baseband signals are coupled to appropriate video and audio decoders to generate the display signals (e.g. RGB) or sound.

Referring to FIG. 1, television receiver 10 includes a tuner 14 for receiving the input RF signal on input terminal 12 and converting the RF signal to an IF signal by one or more frequency conversions. The frequency conversions are generally implemented as single or dual super-heterodyne conversions. In conventional television receivers, the intermediate frequency is dictated by the geographical area the receivers are to be used. Currently, there are five intermediate frequencies being used in the world. For example, in the United States, the IF is 41 to 47 MHz.

Television receiver 10 includes a channel filter 18 and a demodulator 20 for converting the IF signal to video and audio baseband signals. Channel filter 18 is typically a discrete filter implemented as a SAW (Surface Acoustic Wave) filter. The shape of the SAW filter is designed specifically for the format (analog or digital TV) and the television standard (NTSC, PAL or SECAM) of the television signals being received. Demodulator 20 is typically a dedicated component and designed specifically for a predetermined television signal format and a predetermined television standard.

When television receiver 10 is a multi-standard receiver, a bank of channel filters 18a to 18c is provided, each of the channel filters designed for a specific format and standard. To support multi-standard reception, a bank of demodulators 20a to 20c is also provided, each demodulator receiving filtered signals from a corresponding channel filter. For analog television signal reception, the demodulator is a VIF/SIF module. The VIF/SIF module provides a video output called CVBS (Composite Video Baseband Signal) and audio outputs, such as MPX or A2. For digital television signal reception, the demodulator is a digital demodulator typically including a down-converter, an analog-to-digital converter and other supporting circuitry to perform the demodulation. The digital demodulator outputs data in a MPEG data stream.

The conventional multi-standard television receivers have several shortcomings. First, conventional television receivers use discrete analog and digital components. The receivers are typically bigger in size and more costly to manufacture. Second, the conventional multi-standard television receivers require duplicate components to support the different television standards. Consequently, such multi-standard television receivers are large in dimensions and costly to manufacture.

Therefore, it is desirable to provide a multi-standard television receiver that is cost effective to manufacture and has acceptable performance when receiving television signals from a variety of sources.

SUMMARY OF THE INVENTION

A television (TV) receiver includes a multi-standard channel filter with a programmable intermediate frequency adapted to receive television signals in a variety of television standards and formats.

According to one embodiment of the present invention, a receiver includes a tuner and a channel filter. The tuner receives input RF signals encoding information in one of a number of formats and converts the input RF signals to intermediate signals having an intermediate frequency (IF). The intermediate signals are coupled to the channel filter. The channel filter includes an anti-aliasing filter for filtering the intermediate signals, an analog-to-digital converter for sampling the filtered intermediate signals and generating a digital representation thereof, and a signal processor for processing the digital representation of the intermediate signals in accordance with the format of the input RF signal. The signal processor generates digital output signals indicative of information encoded in the input RF signal.

In one embodiment, the formats of the input RF signals include analog television signals and digital television signals.

In another embodiment of the present invention, the receiver further includes a bank of demodulators, each coupled to receive digital output signals from the signal processor. Each of the demodulators operates to demodulate the digital output signals according to one of the formats of the input RF signal and generates the corresponding video and audio baseband signals.

The present invention is better understood upon consideration of the detailed description below and the accompanying drawings.

DETAILED DESCRIPTION OF THE PREFERRED EMBODIMENTS

In accordance with the principles of the present invention, a television (TV) receiver includes a multi-standard channel filter with a programmable intermediate frequency adapted to receive television signals in a variety of television standards and formats. In one embodiment, the channel filter accepts a preselected intermediate frequency regardless of the standards or formats of the television signals. In operation, the channel filter digitizes the incoming television signals and perform signal processing of the incoming signals in the digital domain. By processing all signals in the digital domain, the TV receiver of the present invention eliminates the need for analog components, such as SAW filters. Thus, the TV receiver of the present invention can be readily integrated in one integrated circuit to reduce the size and the manufacturing cost of the receiver. Furthermore, the TV receiver of the present invention reconfigures the same circuit modules to support multi-standard reception, obviating the need to provide duplicate components.

Figure 1:
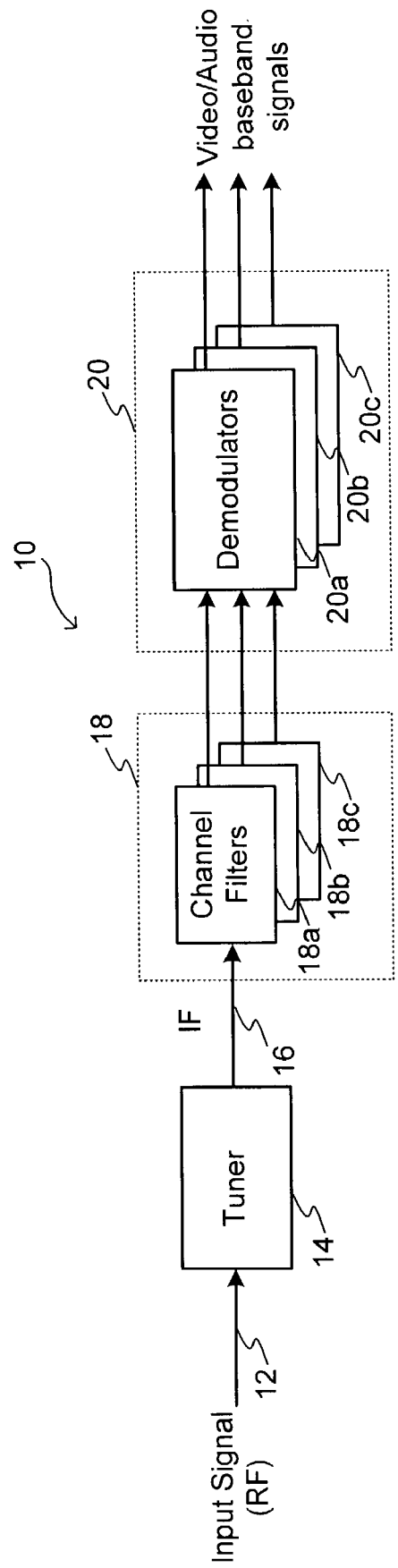
FIG. 1 is a block diagram of a conventional multistandard television receiver.
Figure 2:
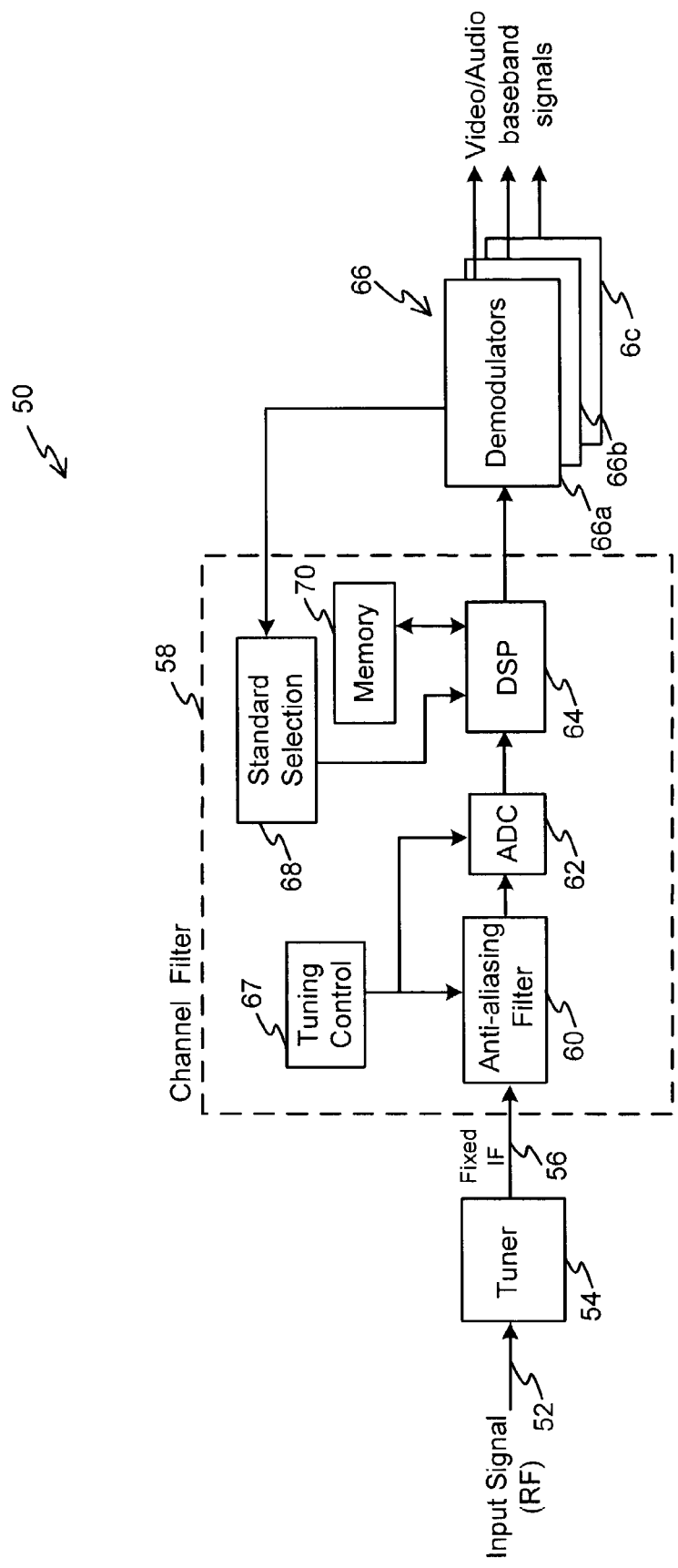
FIG. 2 is a block diagram of a television receiver according to one embodiment of the present invention.

FIG. 2 is a block diagram of a television receiver according to one embodiment of the present invention. Referring to FIG. 2, television receiver 50 receives input RF signals, such as those received on an antenna or on a cable line, on an input terminal 52. The input RF signals are coupled to a tuner 54 which operates to convert the input RF signal to an intermediate signal using one or more frequency conversions. For example, tuner 54 can perform a single or dual super-heterodyne conversion. In one embodiment of the present invention, tuner 54 is a commercially available discrete component and outputs intermediate signals having an intermediate frequency (IF) that is determined by the geographic region of interest. That is, the IF of tuner 54 is based on worldwide standards specified for each geographic region.

In another embodiment of the present invention, tuner 54 is an integrated component of receiver 50. In that case, tuner 54 can be designed to generate intermediate signals having an intermediate frequency of any values. The IF used by tuner can be the same as or different than the IF specified by the worldwide standards. More importantly, because TV receiver 50 includes a multi-standard channel filter 58, tuner 54 can use the same IF for receiving analog or digital television signals in any standards. The value of the IF in an integrated tuner is a matter of design choice. In one embodiment, the IF is selected to be 20 MHz or higher.

Next, TV receiver 50 includes multi-standard channel filter 58 for filtering and processing the intermediate signals from tuner 54. Multi-standard channel filter 58 includes an anti-aliasing filter 60, an analog-to-digital converter (ADC) 62 and a digital signal processor (DSP) 64. As described above, channel filter 58 is capable of receiving intermediate signals from tuner 54 having any intermediate frequency. Furthermore, channel filter 58 digitizes the incoming televisions signals and performs subsequent processing in the digital domain entirely. Thus, by applying the appropriate sampling frequency at the ADC circuit and the appropriate signal processing functions at the DSP circuit, channel filter 58 can handle television signals in any format (analog or digital) and in any standard (NTSC, PAL or ATSC).

Figure 3:
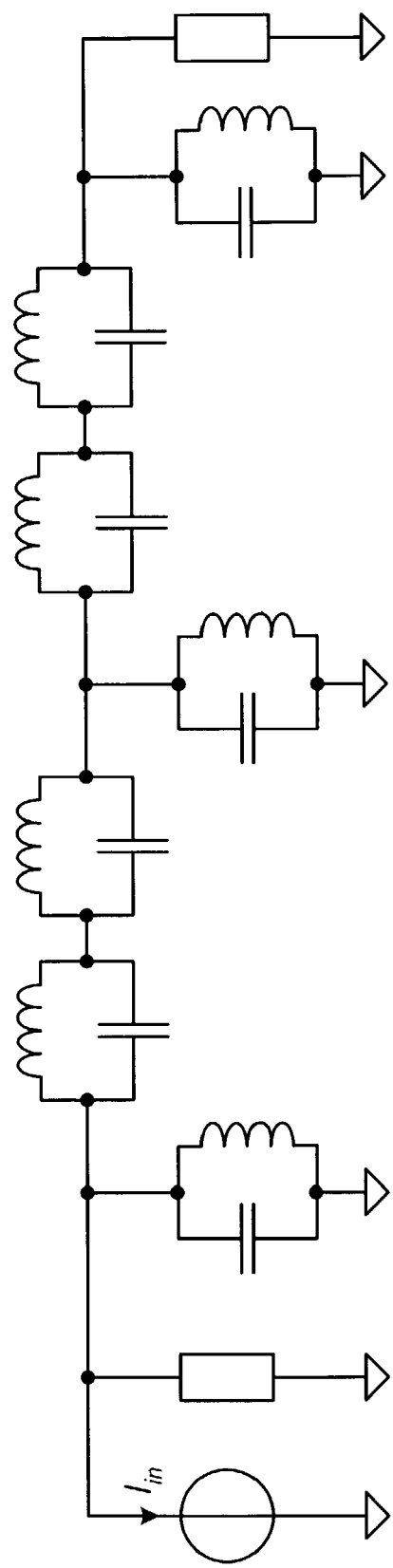
FIG. 3 is a circuit diagram of an anti-aliasing filter which can be used to construct the anti-aliasing filter of FIG. 2.
Figure 4:
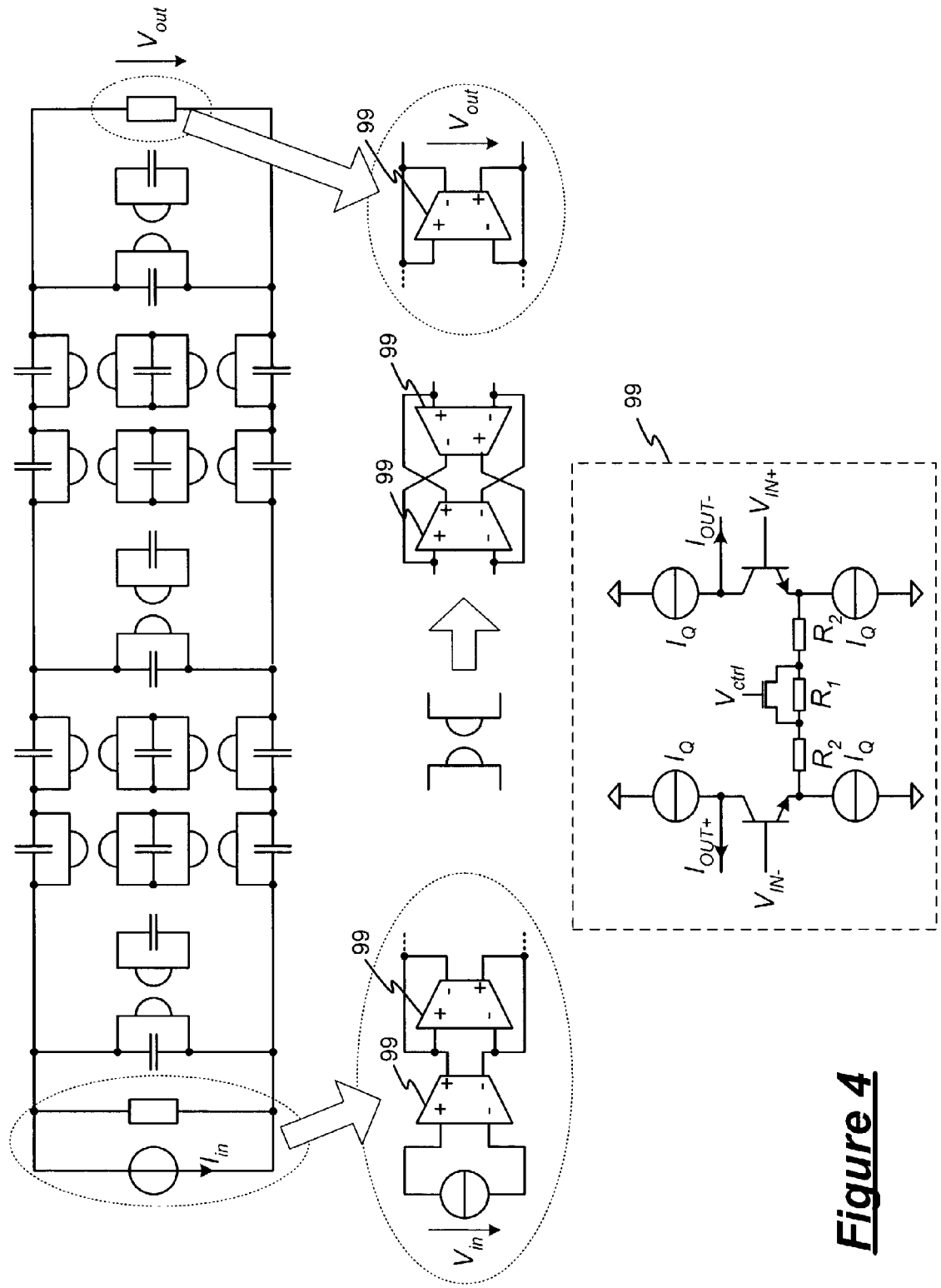
FIG. 4 is a circuit diagram of an anti-aliasing filter which can be used to construct the anti-aliasing filter of FIG. 2.

Anti-aliasing filter 60 performs pre-processing of the intermediate signals from tuner 54 to prevent aliasing from occurring when the intermediate signals are subsequently sampled and digitized by ADC 62. In one embodiment, anti-aliasing filter 60 can be realized with a SAW filter. In another embodiment, anti-aliasing filter 60 is implemented as shown in FIG. 3 using capacitors and inductors. In yet another embodiment, anti-aliasing filter 60 is realized with transconductors (gmC) 99 as shown in FIG. 4. After the filtering operation, ADC 62 operates to sample the filtered intermediate signals to generate a digital representation thereof. In the present embodiment, ADC 62 is a 10-bit converter and has a sampling rate of up to 40 megasamples per second.

The center frequency of anti-aliasing filter 60 and the sampling frequency of ADC 62 are selected based on the intermediate frequency of the intermediate signal. In one embodiment, both the center frequency of anti-aliasing filter 60 and the sampling frequency of ADC 62 are set to be at least twice the bandwidth of the intermediate frequency signal. When anti-aliasing filter 60 is constructed using transconductors as shown in FIG. 4, the center frequency of anti-aliasing filter 60 can be adjusted by varying the voltage Vctrl of transconductors 99. The sampling frequency of ADC 62 can be adjusted by using a voltage controlled oscillator and a phase locked loop. In the present embodiment, a tuning control circuit 67 is included for adjusting the center frequency of anti-aliasing filter 60 and the sampling frequency of ADC 62. Tuning control circuit 67 can receive a control signal external to TV receiver 50, such as a manual control signal from a user. Tuning control circuit 67 can also perform auto-detection of the intermediate frequency of the intermediate signals and adjust the operating frequencies of the anti-aliasing filter and the ADC accordingly.

After the intermediate signal is filtered and digitized, the digital representation of the signal is processed by DSP 64. DSP 64 processes the digital signals according to the television standard to which the input RF signal is encoded.

In the present embodiment, channel filter 58 includes a standard selection circuit 68 for selecting between the several analog television standards and the several digital television standards. DSP 64 applies the appropriate filter function, such as an impulse response, to the digital signals depending on the state of standard selection circuit 68. In one embodiment, the coefficients of the filter functions are stored in a look-up table in a memory 70. DSP 64 retrieves the coefficients from memory 70 to be applied to the incoming digital signals.

DSP 64 is a programmable and reconfigurable processor. In the present embodiment, DSP 64 implements a finite impulse response (FIR) filter which is reconfigured based on the TV standard selected. Furthermore, in the present embodiment, DSP 64 includes two computing units to speed up the computation time. Specifically, the filtering operations of the real and imaginary parts in the frequency domain are carried out in parallel. In other embodiments, DSP 64 may include only one computing unit.

Standard selection circuit 68 can be implemented in one of many ways. The selection of the correct standard can be made manually by the user of the television system, such as by activating a switch, or the selection can be made automatically by providing an auto-detection capability in TV receiver 50. In the present embodiment, auto-detection is implemented by detecting in the baseband signals the presence or absence of carrier signals which uniquely identify the television standards. For example, analog television signals can be identified by the analog visual carrier signal while digital television signals can be identified by the pilot carrier. Each demodulator in bank 66 generates a signal which is fed back to standard selection circuit 68 indicating which television standard the input signal is encoded. In other embodiments, other means for selecting between the different standards can be used.

Figure 5:
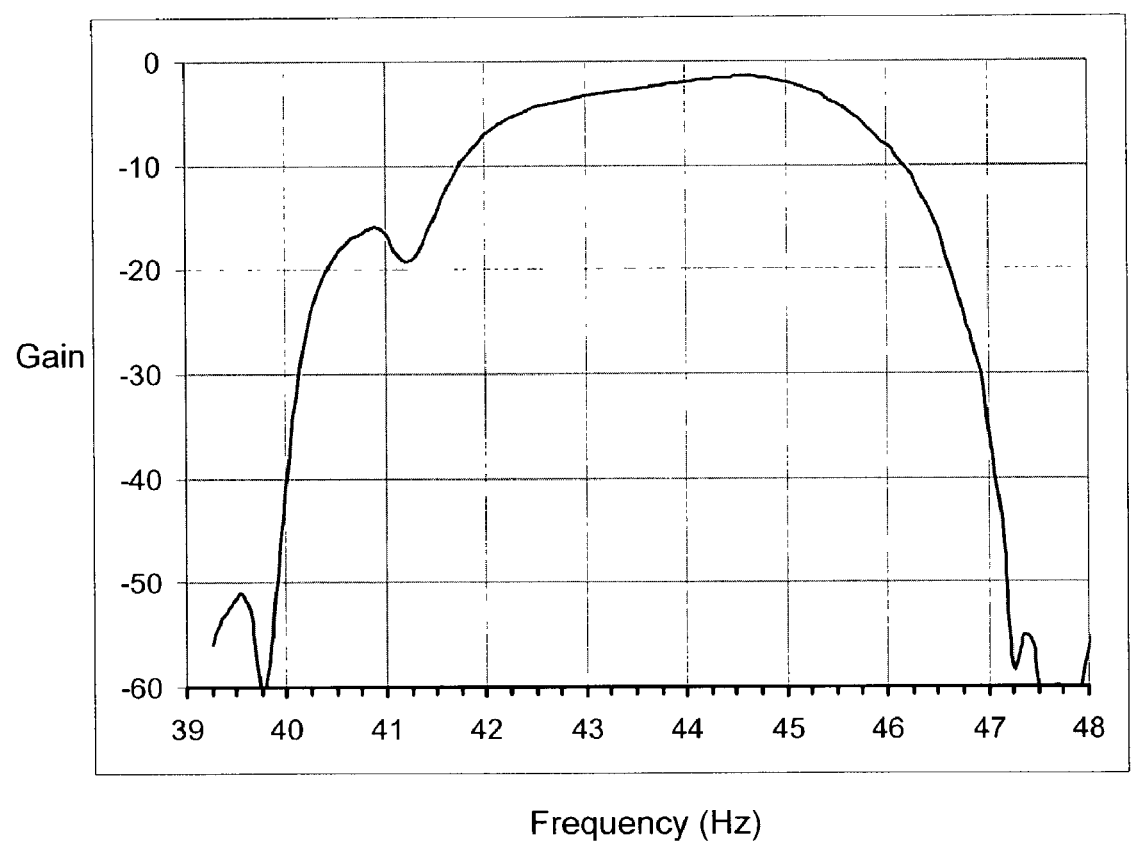
FIG. 5 is a waveform of a filter function that can be implemented in the DSP of FIG. 2 for processing analog television signals.

When the input RF signal is an analog television signal, DSP 64 applies a video filter function and a sound filter function to the digitized signals to separate the video signals from the audio signals. The video and sound filters can be implemented as FIR filters. An example of such filter function is shown in FIG. 5. DSP 64 can also implement other filter functions such as ghost cancellation for reducing the interference of the input signal. The filter response is then derived from the measured channel response.

When the input RF signal is a digital television signal, DSP 64 applies a filter function to the digitized signals. The filter function can be implemented as a FIR filter. An example is the ATSC-VSB standard where the filter response is specified as raised root cosine with 0.114 roll-off (refer to the ATSC A-83 specification). Furthermore, additional filter functions, such as an equalizer for echo cancellation (multipath), can also be implemented in DSP 64. The filter response is then derived from the measured channel response.

The output signals from channel filter 58 are coupled to a bank of demodulators 66 for generating into the appropriate video and audio baseband signals. The video and audio baseband signals are usually coupled to video and audio decoders before being displayed or playback on a view screen.

In the present embodiment, demodulators 66 include a demodulator for analog television signals 66*a*, a demodulator for digital television signals 66*b* and a demodulator 66*c* for digital data channels.

Analog demodulator 66*a* performs demodulation of the analog television signals in the digital domain. In cases where analog demodulator 66*a* receives analog input signals only, a digital-to-analog converter (DAC) (not shown) can be included between the output terminal of DSP 64 and the input terminal of analog demodulator 66*a*.

Analog demodulator 66*a* provides three output signals: a Composite Video Baseband Signal (CVBS) containing the video information, and audio 1 and audio 2 containing the audio information. Audio 1 and audio 2 signals can be AM modulated, FM modulated or Intercarrier signals. The intercarrier signal is a signal that can contain any format of modulated sound. It is usually connected to an external audio decoder. By using standard output signals, TV receiver 50 can readily interface with other standard components, such as a video and sound decoder, thereby providing compatibility with existing television components. An additional digital-to-analog converter may be coupled to the output terminal of demodulator 66*a* if analog output signals are desired.

Digital demodulator 66*b* operates to decode the incoming digital television signal. Typically, digital television signals are modulated in a VSB, QAM or COFDM scheme. Digital demodulator 66*b* generates an MPEG data stream as output signals, thereby providing compatibility with other existing television components.

In one embodiment of the present invention, TV receiver 50 is an integrated circuit where tuner 54, channel filter 58 and demodulators 66 are all integrated onto the same piece of integrated circuit. In another embodiment, TV receiver 50 can be manufactured as two or more integrated circuits.

The advantages of the television receiver of the present invention are numerous.

First, the television reciever of the present invention can be configured as a broadband receiver for receiving multistandard analog or digital television signals, and broadcast data channels. Furthermore, the receiver can be configured to receive analog television channels from different television standards. Thus, the television receiver can be readily adaptable for use worldwide for television reception.

Second, the television receiver of the present invention can be used to receive television signals distributed in any manner and provides excellent reception performance. Thus, the TV receiver of the present invention can be used for the reception of terrestrial broadcast and cable transmission.

Third, the television reciever of the present invention eliminates the needs for analog components, such as SAW filters. Therefore, all the circuit modules of the TV receiver, including filtering functions, equalizer, ghost cancellation and video and sound splitter can be integrated onto the same integrated circuit. Increasing the level of component integration has the effect of reducing the size of the receiver and the manufacturing cost thereof.

Lastly, the television receiver of the present invention provides interfaces that are compatible with interfaces of existing components. Specifically, the television receiver of the present invention provides video, audio and MPEG output signals that are compatible with analog or digital television standards so that the receiver can be readily adapted into existing television systems.

The above detailed descriptions are provided to illustrate specific embodiments of the present invention and are not intended to be limiting. Numerous modifications and variations within the scope of the present invention are possible. The present invention is defined by the appended claims.

We claim:

1. A receiver comprising:
   a tuner for receiving input RF signals and for converting said input RF signals to intermediate signals having an intermediate frequency (IF), said input RF signals encoding information in one of a plurality of formats; and
   a channel filter for receiving the intermediate signals, said channel filter comprising:
   an anti-aliasing filter for filtering said intermediate signals;
   an analog-to-digital converter for sampling said filtered intermediate signals and generating a digital representation thereof;
   a signal processor for processing said digital representation of said intermediate signals in accordance with said format of said input RF signal, said signal processor generating digital output signals indicative of information encoded in said input RF signal; and a plurality of demodulators, each coupled to receive output signals from said signal processor, each of said demodulators for demodulating said digital output signals according to one of said formats of said input RF signal, each of said demodulators generating video and audio baseband signals corresponding to said format of said input RF signal.

2. The receiver of claim 1, wherein said plurality of formats comprise an analog television format and a digital television format.

3. The receiver of claim 1, further comprising:

a digital-to-analog converter coupled between said signal processor and a first one of said plurality of demodulators, said digital-to-analog converter converting said digital output signals to an analog format.

4. The receiver of claim 1, wherein said intermediate frequency comprises a frequency value specified by one or more television standards.

5. The receiver of claim 1, wherein said intermediate frequency comprises a frequency value other than those specified by one or more television standards.

6. The receiver of claim 1, wherein a center frequency of said anti-aliasing filter and a sampling frequency of said analog-to-digital converter are functions of said intermediate frequency.

7. The receiver of claim 6, wherein said channel filter further comprises a tuning control circuit for adjusting said center frequency and said sampling frequency to frequency values derived from said intermediate frequency.

8. The receiver of claim 1, wherein said anti-aliasing filter comprises a transconductance (gmC) filter function.

9. The receiver of claim 1, wherein said analog-to-digital converter is a 10-bit converter.

10. The receiver of claim 1, wherein said signal processor applies one of a plurality of finite impulse response filters to said digital representation of said intermediate signal, each of said plurality of finite impulse response corresponding to a format of said input RF signal.

11. The receiver of claim 10, wherein said plurality of finite impulse response filters are stored in a memory, and said signal processor indexes said memory to retrieve one of said plurality of finite impulse response filters.

12. The receiver of claim 10, wherein said signal processor comprises a first computing unit and a second computing unit, said first computing unit processing a real part of said finite impulse response filter operation while said second computing unit processing an imaginary part of said finite impulse response filter operation.

13. The receiver of claim 10, wherein said channel filter further comprises a standard selection circuit coupled to said signal processor, said standard selection circuit generating a select signal indicative of a format of said input RF signal and said signal processor selecting a finite impulse response filter in response to said select signal.

14. The receiver of claim 13, wherein said standard selection circuit generates said select signal in response to an input signal from a user.

15. The receiver of claim 13, wherein said standard selection circuit generates said select signal by detecting carrier signals identifying one of said formats of said input RF signals.

16. The receiver of claim 1, wherein said input RF signals comprise RF signals received from one of terrestrial broadcast, from satellite broadcast, and from cable transmission.

17. A method for receiving input RF signal comprising:

receiving said input RF signals encoding information in one of a plurality of formats;

converting said input RF signals to intermediate signals having an intermediate frequency;

applying a first filter function to said intermediate signals, said first filter function being an anti-aliasing filter and having a center frequency;

digitizing said filtered intermediate signals at a sampling frequency;

processing said digitized signals in accordance with said format of said input RF signals and generating digital output signals indicative of information encoded in said input RF signals; and demodulating using a plurality of demodulators said processed digitized signals to generate baseband signals corresponding to said format of said input RF signals.

18. The method of claim 17, wherein said plurality of formats comprise an analog television format and a digital television format.

19. The method of claim 17, wherein said processing said digital signals is performed in response to a select signal indicative of said format of said input RF signal.

20. The method of claim 19, further comprising:

generating said select signal by detecting carrier signals in said input RF signal identifying said format of said input RF signal.

21. The method of claim 17, wherein said center frequency and said sampling frequency are functions of said intermediate frequency.

* * * * *